United States Patent
Kim

(10) Patent No.: US 7,986,092 B2
(45) Date of Patent: Jul. 26, 2011

(54) ORGANIC LIGHT EMITTING DIODE DISPLAY

(75) Inventor: Eun-Ah Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 70 days.

(21) Appl. No.: 12/410,158

(22) Filed: Mar. 24, 2009

(65) Prior Publication Data

US 2010/0007268 A1    Jan. 14, 2010

(30) Foreign Application Priority Data

Jul. 8, 2008    (KR) .................. 10-2008-0066079

(51) Int. Cl.
*H01J 1/62*        (2006.01)
*H01J 63/04*       (2006.01)

(52) U.S. Cl. ......... 313/504; 313/498; 313/506; 313/512

(58) Field of Classification Search .......... 313/498–512, 313/238, 240
See application file for complete search history.

(56) References Cited

U.S. PATENT DOCUMENTS

| | | | |
|---|---|---|---|
| 5,313,055 A | 5/1994 | Shiratsuki et al. | |
| 2004/0075637 A1 | 4/2004 | Izumi | |
| 2004/0263670 A1 | 12/2004 | Yamasaki | |
| 2005/0116619 A1* | 6/2005 | Kuma et al. | 313/503 |
| 2005/0275343 A1 | 12/2005 | Tanaka et al. | |
| 2007/0063645 A1* | 3/2007 | Yokoyama | 313/506 |
| 2008/0211394 A1* | 9/2008 | Koshihara et al. | 313/504 |
| 2008/0211395 A1* | 9/2008 | Koshihara et al. | 313/504 |
| 2008/0284331 A1* | 11/2008 | Hayashi | 313/512 |

FOREIGN PATENT DOCUMENTS

| | | |
|---|---|---|
| CN | 1497507 A | 5/2004 |
| EP | 0571 214 A1 | 11/1993 |
| JP | 10-070713 | 3/1998 |
| JP | 2005-010407 | 1/2005 |
| JP | 2005-107890 | 4/2005 |
| JP | 2008-091037 | 4/2008 |
| KR | 10-2005-0002606 | 1/2005 |
| KR | 10-2007-0083352 | 8/2007 |
| KR | 10-0762682 B1 | 9/2007 |

OTHER PUBLICATIONS

European Search Report dated Feb. 22, 2011, for corresponding European Patent application 09251759.8.

* cited by examiner

*Primary Examiner* — Joseph L Williams
*Assistant Examiner* — Kevin Quarterman
(74) *Attorney, Agent, or Firm* — Christie, Parker & Hale, LLP

(57) ABSTRACT

An OLED display including a first substrate on which a plurality of OLEDs are formed, a second substrate attached with the first substrate, a photo sensor formed on the second substrate and for detecting incident light generated by an external source, and a plurality of shield layers covering the photo sensor and for blocking (or preventing) light emitted from the OLED from being detected by the photo sensor.

20 Claims, 3 Drawing Sheets

[FIG. 1]
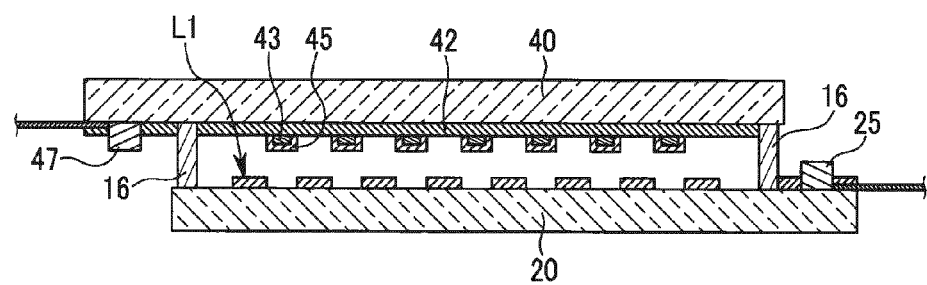
[FIG. 2]
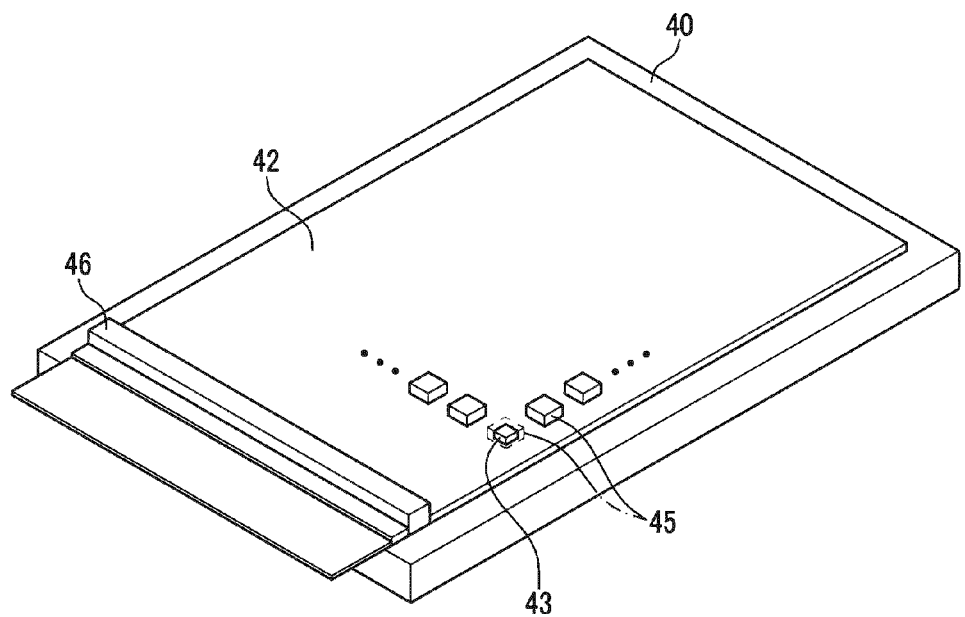

[FIG. 3]
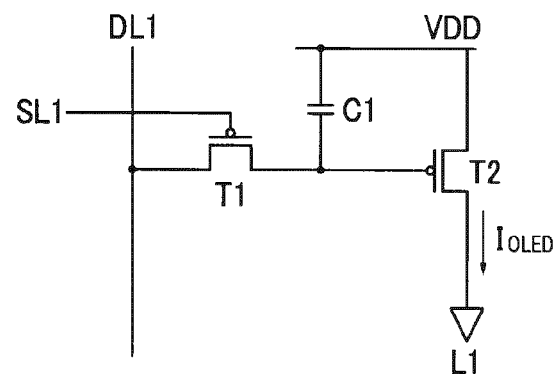
[FIG. 4]
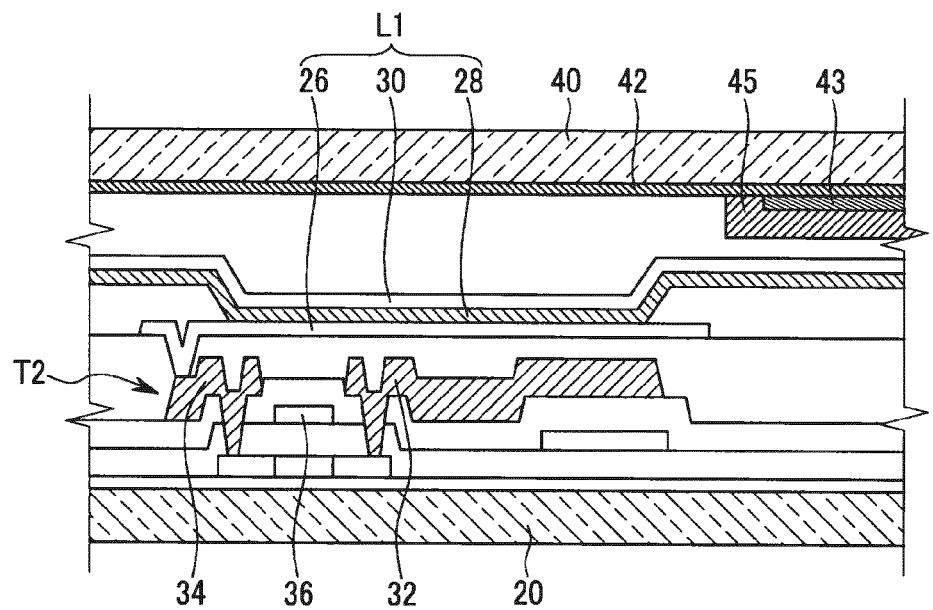

[FIG. 5]
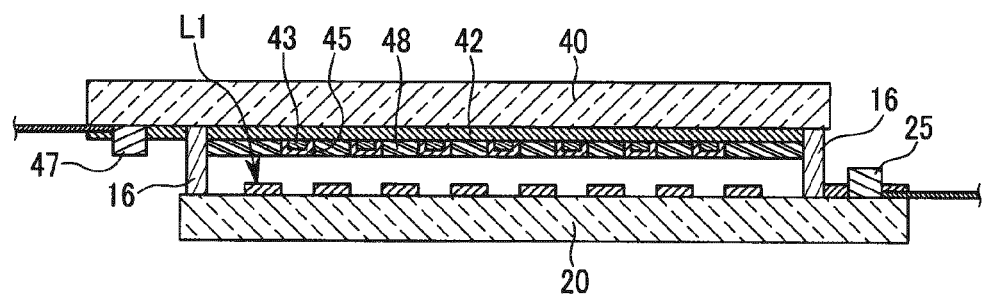

ORGANIC LIGHT EMITTING DIODE DISPLAY

CROSS-REFERENCE TO RELATED APPLICATION

This application claims priority to and the benefit of Korean Patent Application No. 10-2008-0066079, filed in the Korean Intellectual Property Office, on Jul. 8, 2008, the entire content of which is incorporated herein by reference.

BACKGROUND OF THE INVENTION

1. Field of the Invention

The present invention relates to an organic light emitting diode (OLED) display. More particularly, the present invention relates to an OLED display having a touch panel.

2. Description of the Related Art

An organic light emitting diode (OLED) display includes a plurality of organic light emitting diodes (OLEDs). Each of the OLEDs includes a hole injection electrode, an organic emission layer, and an electron injection electrode, and light is emitted by energy that is generated when an exciton generated by coupling of electrons and holes falls from an exited state to a ground state within the organic emission layer.

Because the OLED display is a self-luminance display (due to its ability to self-generate light) and does not require a separate light source (unlike a liquid crystal display (LCD)), thickness and weight thereof can be reduced. Further, because the OLED display has desired display quality characteristics, such as low power consumption, high luminance, and high reaction speed, the OLED display is appropriate for use as a next generation display in a mobile electronic device.

In general, the OLED display includes a panel assembly in which a plurality of OLEDs are formed, a bezel coupled to the panel assembly at a rear side of the panel assembly, and a printed circuit board (PCB) that is electrically connected to the panel assembly through a flexible printed circuit board (FPBC).

As a new input method that can replace a conventional input method (e.g., mouse or keyboard), a touch screen enables direct input of data to a screen by using a hand or a pen. Particularly, the touch screen enables a user to directly perform desired work while viewing the screen, and it is easy to operate so that it has been evaluated as an ideal input method for a graphic user interface (GUI). It has been used in various fields such as mobile phones, PDAs, terminals in banks and public offices, medical equipments, and information display devices in tourist agencies and other suitable agencies.

The touch screen can be broadly classified as one using a resistance film method, a capacitance method, an ultrasonic wave method, or a light (infrared) method. In the resistance film method, two substrates (each of which is coated by a transparent conductive layer) face each other, and a dot spacer is interposed therebetween.

According to the resistance film method, an electric signal is applied to one of the transparent conductive layers for detecting a location, and a user presses an upper substrate with a finger or a pen. Then, the transparent conductive layer of the front substrate contacts the transparent conductive layer of the rear substrate so that the opposite transparent conductive layer detects the electric signal. Here, a location is detected by using the intensity of the detected electric signal. However, the resistance film method has low detection accuracy because the intensity of the signal varies in accordance with the applied pressure. Further, when the user presses the touch panel, the press load is directly delivered to an OLED panel, which may damage the OLED panel.

In the light method, a photo sensor is provided to detect variation of incident light and generate a corresponding electric signal, and a location is detected on the basis of the electric signal. According to the light method, the touch screen can provide high detection accuracy because a signal is generated not by pressure but only by contact. However, the light method may be influenced by light emitted from an OLED, thereby causing malfunctions.

The above information disclosed in this Background section is only for enhancement of understanding of the background of the invention and may contain information that does not form the prior art.

SUMMARY OF THE INVENTION

An aspect of an embodiment of the present invention is directed toward an organic light emitting diode (OLED) display having a touch screen using a photo sensor that can prevent (or reduce) malfunctions by preventing (or protecting from) interference of internal light.

An OLED display according to an embodiment of the present invention includes: a first substrate; a plurality of OLEDs on the first substrate; a second substrate attached with the first substrate; a photo sensor on the second substrate and for detecting incident light generated by an external source; and a plurality of shield layers covering the photo sensor and for blocking light emitted from the OLEDs from being detected by the photo sensor.

The shield layers may be formed in a plane that faces the OLEDs, and each of the shield layers may be a black matrix. Each of the shield layers may include a material selected from the group consisting of a metal insulator hybrid layer (MIHL), a black polymer, carbon black, and combinations thereof.

A color filter may be formed between the plurality of shield layers. The plurality of shield layers may be arranged in a matrix format, and the plurality of OLEDs may be formed in a matrix format. The photo sensor may be provided in a space above and between the plurality of OLEDs.

A touch electrode may be formed between the photo sensor and the second substrate, and may be made of a transparent conductive material. The touch electrode may include a material selected from the group consisting of indium tin oxide (ITO), indium zinc oxide (IZO), aluminum-doped zinc oxide (AZO), gallium-doped zinc oxide (GZO), fluorine tin oxide (FTO), antimony-doped tin oxide (ATO), and combinations thereof.

An OLED display according to another embodiment of the present invention includes: a first substrate; a plurality of OLEDs on the first substrate; a second substrate attached with the first substrate; a plurality of shield layers between the OLEDs and the second substrate; and a plurality of photo sensors, each of the photo sensors being covered by a corresponding one of the shield layers and between the corresponding one of the shield layers and the second substrate.

Each of the shield layers may be a black matrix, and a plane of the photo sensor, facing the OLED, may be covered by the shield layers. In addition, the OLED display may further include a touch electrode formed to contact the photo sensor.

BRIEF DESCRIPTION OF THE DRAWINGS

FIG. 1 is a cross-sectional view of an organic light emitting diode (OLED) display according to a first exemplary embodiment of the present invention.

FIG. 2 is a perspective view of a first substrate and members provided on the first substrate of FIG. 1.

FIG. 3 shows a sub-pixel circuit of the OLED display of FIG. 1.

FIG. 4 is a partially expanded cross-sectional view of the inside of the OLED display of FIG. 1.

FIG. 5 is a cross-sectional view of an OLED display according to a second exemplary embodiment of the present invention.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

FIG. 1 shows a cross-sectional view of an organic light emitting diode (OLED) display according to a first exemplary embodiment of the present invention. FIG. 2 is a perspective view of a first substrate and members provided in the first substrate of FIG. 1.

Referring to FIG. 1, the OLED display according to the present exemplary embodiment includes a first substrate 20, a plurality of OLEDs L1 provided in a display area of the first substrate 20, a second substrate 40 combined with (attached with or coupled to) the first substrate 20 by a sealing unit 16, and a photo sensor 43 formed on the second substrate 40.

The OLEDs L1 are disposed in a matrix format in the first substrate 20, and an integrated circuit chip 25 is mounted on an external side of the area where the OLEDs L1 are provided through a chip-on-glass (COG) method.

A touch electrode 42, the photo sensor 43 connected to the touch electrode 42, and a shield layer 45 that covers the photo sensor 43 are formed on the second substrate 40. The touch electrode 42, the photo sensor 43, and the shield layer 45 are formed at the internal side (i.e., a plane that faces the first substrate) of the second substrate 40.

According to the present exemplary embodiment, the shield layer 45 and the photo sensor 43 are formed on the second substrate 40, but they are not limited thereto. For example, the shield layer 45 and the photo sensor 43 may be formed on the first substrate.

In addition, according to the present exemplary embodiment, the first substrate 20 and the second substrate 40 are separated from each other, but they are not limited thereto. A filter may also be provided in a space between the first substrate 20 and the second substrate 40.

The touch electrode 42 can be made of one or more conductive materials such as indium tin oxide (ITO), indium zinc oxide (IZO), aluminum-doped zinc oxide (AZO), gallium-doped zinc oxide (GZO), fluorine tin oxide (FTO), and antimony-doped tin oxide (ATO). The photo sensor 43 that generates a signal by detecting a change in external light is disposed in a matrix format between the OLEDs L1, and are arranged (or configured) to allow light emitted from each of the OLEDs L1 to be emitted without any interruption.

As shown in FIG. 2, the shield layer 45 is formed to cover a plane of the photo sensor 43 (which faces the first substrate 20) and a circumference side of the plane so as to shield influence of light emitted from the OLED L1 to the photo sensor 43. Therefore, a plane of the photo sensor 43, which faces the second substrate 40, is not covered by the shield layer 45 so that a change of light occurring at the front side of the second substrate 40 can be sensed.

The shield layer 45 may be formed as (or as part of) a black matrix. The black matrix improves contrast by preventing (or protecting from) light leakage, and is formed of a metal insulator hybrid layer (MIHL), a black polymer, and/or carbon black. An insulation layer of the MIHL can be made of $SiO_2$ and/or $SiN_x$, and a metal component may be formed of Cr, Al, Mo, W, Ti, Ag, Cu, and/or chromium oxide.

When the shield layer 45 is formed as (or as part of) the black matrix, it can be easily formed during a process of forming the black matrix rather than forming a separate layer, and contrast can be improved.

An integrated circuit chip 47 is mounted on an external side of an area where the photo sensor 43 is formed in the second substrate 40 in order to analyze and transmit a signal input through the photo sensor 43.

FIG. 3 shows a sub-pixel circuit structure of the OLED display of FIG. 1, and FIG. 4 shows a partially enlarged cross-sectional view of an internal structure of the OLED display of FIG. 1.

Referring to FIG. 3 and FIG. 4, a sub-pixel of the OLED display is formed of an OLED L1 and a driving circuit. The OLED L1 includes an anode 26, an organic emission layer 28, and a cathode 30, and the driving circuit includes at least two thin film transistors T1 and T2 and a storage capacitor C1. In one embodiment, the at least two thin film transistors T1 and T2 include a switching transistor T1 and a driving transistor T2.

The switching transistor T1 is connected with a scan line SL1 and a data line DL1, and transmits a data voltage input to the data line DL1 to the driving transistor T2 according to a switching voltage input to the scan line SL1. The storage capacitor C1 is connected with the switching transistor T1 and a power source line VDD, and stores a voltage that corresponds to a voltage difference between a voltage transmitted from the switching transistor T1 and a voltage supplied to the power source line VDD.

The driving transistor T2 is connected with the power source line VDD and the storage capacitor C1 and supplies an output current $I_{OLED}$ that proportionally corresponds to the square of a voltage difference of the voltage supplied to the power source line VDD and a threshold voltage stored in the storage capacitor C1 to the OLED L1, and the OLED L1 emits light due to the output current $I_{OLED}$. The driving transistor T2 includes a source electrode 32, a drain electrode 34, and a gate electrode 36. In one embodiment, the anode 26 of the OLED L1 is connected to the drain electrode 34 of the driving transistor T2. A configuration of the sub-pixel is not limited as described, and can be suitably changed.

The photo sensor 43 is formed on the second substrate 40 that is close to (or near) the above-stated sub-pixel. A plurality of photo sensors 43 are disposed in a matrix format on the second substrate 40, and each photo sensor 43 is covered by the shield layer 45. The shield layer 45 is formed as a black matrix in a space between sub-pixels.

Such a shield layer 45 can not only improve contrast by preventing (or protecting from) light leakage, but can also realize a touch panel function by preventing (or protecting) the photo sensor 43 from being influenced by internal light. When an external material (e.g., finger or pen) approaches, the photo sensor 43 detects the approach and generates a corresponding signal and performs a command of a corresponding location.

FIG. 5 shows a cross-sectional view of an OLED display according to a second exemplary embodiment of the present invention. Referring to FIG. 5, the OLED display according to the present exemplary embodiment includes color filter layers 48 formed between shield layers 45. The color filter layer 48 is formed by arranging color filters of red (R), green (G), and blue (B) colors in a set or predetermined sequence in a sub-pixel area. Here, space efficiency can be improved and an image can be more stably displayed by forming the color filter layer 48 between the shield layers 45.

In view of the foregoing, an OLED display according to the above-described exemplary embodiments of the present invention reduces interference of internal light by forming a shield layer in a photo sensor so that a touch screen with high sensitivity can be provided.

In addition, the shield layer is formed as a black matrix so that contrast of the OLED display can be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
   a first substrate;
   a plurality of OLEDs on the first substrate;
   a second substrate attached with the first substrate;
   a photo sensor on the second substrate and for detecting incident light generated by an external source; and
   a plurality of shield layers covering the photo sensor and for blocking light emitted from the OLEDs from being detected by the photo sensor.

2. The OLED display of claim 1, wherein the shield layers are in a plane facing the OLEDs.

3. The OLED display of claim 1, wherein each of the shield layers is a black matrix.

4. The OLED display of claim 1, wherein each of the shield layers comprises a material selected from the group consisting of a metal insulator hybrid layer (MIHL), a black polymer, carbon black, and combinations thereof.

5. The OLED display of claim 1, further comprising a color filter between the shield layers.

6. The OLED display of claim 1, wherein the shield layers are arranged in a matrix format.

7. The OLED display of claim 1, wherein the OLEDs are arranged in a matrix format.

8. The OLED display of claim 7, wherein the photo sensor is in a space above and between the OLEDs.

9. The OLED display of claim 1, further comprising a touch electrode between the photo sensor and the second substrate.

10. The OLED display of claim 9, wherein the touch electrode comprises a transparent conductive material.

11. The OLED display of claim 9, wherein the touch electrode comprises a material selected from the group consisting of indium tin oxide (ITO), indium zinc oxide (IZO), aluminum-doped zinc oxide (AZO), gallium-doped zinc oxide (GZO), fluorine tin oxide (FTO), antimony-doped tin oxide (ATO), and combinations thereof.

12. The OLED display of claim 1, further comprising:
    a color filter on the second substrate and adjacent to the shield layers; and
    a touch electrode is between the photo sensor and the second substrate.

13. An organic light emitting diode (OLED) display comprising:
    a first substrate;
    an OLED on the first substrate;
    a second substrate attached with the first substrate;
    a photo sensor on the second substrate and for detecting incident light generated by an external source; and
    a shield layer covering the photo sensor and for blocking light emitted from the OLED from being detected by the photo sensor.

14. The OLED display of claim 13, wherein the shield layer is in a plane facing the OLED.

15. The OLED display of claim 13, wherein the shield layer is a black matrix.

16. The OLED display of claim 13, wherein the shield layer comprises a material selected from the group consisting of a metal insulator hybrid layer (MIHL), a black polymer, carbon black, and combinations thereof.

17. An organic light emitting diode (OLED) display comprising:
    a first substrate;
    a plurality of OLEDs on the first substrate;
    a second substrate attached with the first substrate;
    a plurality of shield layers between the OLEDs and the second substrate; and
    a plurality of photo sensors, each of the photo sensors being covered by a corresponding one of the shield layers and between the corresponding one of the shield layers and the second substrate.

18. The OLED display of claim 17, wherein each of the shield layers is a black matrix.

19. The OLED display of claim 17, wherein a plane of the photo sensors, facing the OLEDs, is covered by the shield layers.

20. The OLED display of claim 17, further comprising a touch electrode contacting the photo sensors.

* * * * *